(12) United States Patent
Nguyen

(10) Patent No.: US 6,982,905 B2
(45) Date of Patent: Jan. 3, 2006

(54) METHOD AND APPARATUS FOR READING NAND FLASH MEMORY ARRAY

(75) Inventor: Dzung H. Nguyen, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 145 days.

(21) Appl. No.: 10/682,585

(22) Filed: Oct. 9, 2003

(65) Prior Publication Data
US 2005/0078518 A1 Apr. 14, 2005

(51) Int. Cl.
G11C 16/04 (2006.01)
(52) U.S. Cl. .................. 365/185.17; 365/185.18; 365/185.22
(58) Field of Classification Search .......... 365/185.17, 365/185.18, 185.22
See application file for complete search history.

(56) References Cited

U.S. PATENT DOCUMENTS

| 6,614,683 | B1 | 9/2003 | Parker |
| 6,643,177 | B1 | 11/2003 | Le |
| 6,665,213 | B1 | 12/2003 | Michael |
| 6,819,592 | B2 * | 11/2004 | Noguchi et al. ....... 365/185.17 |

* cited by examiner

*Primary Examiner*—Huan Hoang
(74) *Attorney, Agent, or Firm*—Leffert Jay & Polglaze, P.A.

(57) ABSTRACT

The method for reading/verifying a NAND flash memory device alternates the select gate biasing in response to the position of the cell to be read. If the cell is closer to the top of the column, the SG(D) line is biased prior to the SG(S) line. If the cell is closer to the bottom of the column, the SG(S) line is biased prior to the SG(D) line.

20 Claims, 6 Drawing Sheets

US 6,982,905 B2

METHOD AND APPARATUS FOR READING NAND FLASH MEMORY ARRAY

TECHNICAL FIELD OF THE INVENTION

The present invention relates generally to memory devices and in particular the present invention relates to NAND flash memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Two common types of flash memory array architectures are the "NAND" and "NOR" architectures, so called for the logical form in which the basic memory cell configuration or each is arranged. In the NOR array architecture, the floating gate memory cells of the memory array are arranged in a matrix. The gates of each floating gate memory cell of the array matrix are coupled by rows to word select lines and their drains are coupled to column bit lines. The NOR architecture floating gate memory array is accessed by a row decoder activating a row of floating gate memory cells by selecting the word select line coupled to their gates. The row of selected memory cells then place their data values on the column bit lines by flowing different currents depending on if a particular cell is in a programmed state or an erased state.

A NAND array architecture also arranges its array of floating gate memory cells in a matrix such that the gates of each floating gate memory cell of the array are coupled by rows to word select lines. However each memory cell is not directly coupled to a column bit line by its drain. Instead, the memory cells of the array are coupled together in series, source to drain, between a source line and a column bit line.

The NAND architecture floating gate memory array is accessed by a row decoder activating a row of floating gate memory cells by selecting the word select line coupled to their gates. A high bias voltage is applied to a select gate drain line SG(D). In addition, the word lines coupled to the gates of the unselected memory cells of each group are driven to operate the unselected memory cells of each group as pass transistors so that they pass current in a manner that is unrestricted by their stored data values. Current then flows from the source line to the column bit line through each series coupled group, restricted only by the selected memory cells of each group. This places the current encoded data values of the row of selected memory cells on the column bit lines.

FIG. 1 illustrates voltages at various times during typical prior art NAND verify and read operations. Between times T1 and T3, the select gate source SG(S) line is biased with 4.5V. Also during this time, the unselected wordlines are biased with the same voltage. In this example, only WL0 is shown. The selected wordlines are typically between 0V and 0.2V.

Between times T3 and T4 the SG(D) line is biased with 4.5V until the bitline discharges at time T5. The 4.5V bias is removed from all of the lines at time T6.

One problem that might occur with NAND arrays, however, is illustrated in FIG. 1. Due to the small geometry of the NAND architecture, WL0 and SG(D) are capacitively coupled. Similarly, WL32 and SG(S) are capacitively coupled. When the 4.5V bias is applied to the SG(D) line, WL0 also increases by 1.0–1.5V above the 0.2V already on the line. This has the potential to cause read errors since the cells on WL0 are turned on when they are not supposed to be selected.

For the reasons stated above, and for other reasons stated below which will become apparent to those skilled in the art upon reading and understanding the present specification, there is a need in the art for an improved method for reading NAND memory cells.

SUMMARY

The above-mentioned problems with NAND flash memory and other problems are addressed by the present invention and will be understood by reading and studying the following specification.

The present invention encompasses a method for reading and/or verifying a NAND flash memory array. The array comprises a column of memory cells that have one end controlled by a select gate drain line and the other end controlled by a select gate source line. An input address signal is decoded to determine which cell to select. The order of biasing of the select gate drain and the select gate source lines is responsive to the position of the selected cell in the column. If the selected cell is closer to the selected gate drain line, that select gate is biased before the select gate source line.

Further embodiments of the invention include methods and apparatus of varying scope.

DETAILED DESCRIPTION

Figure 1:
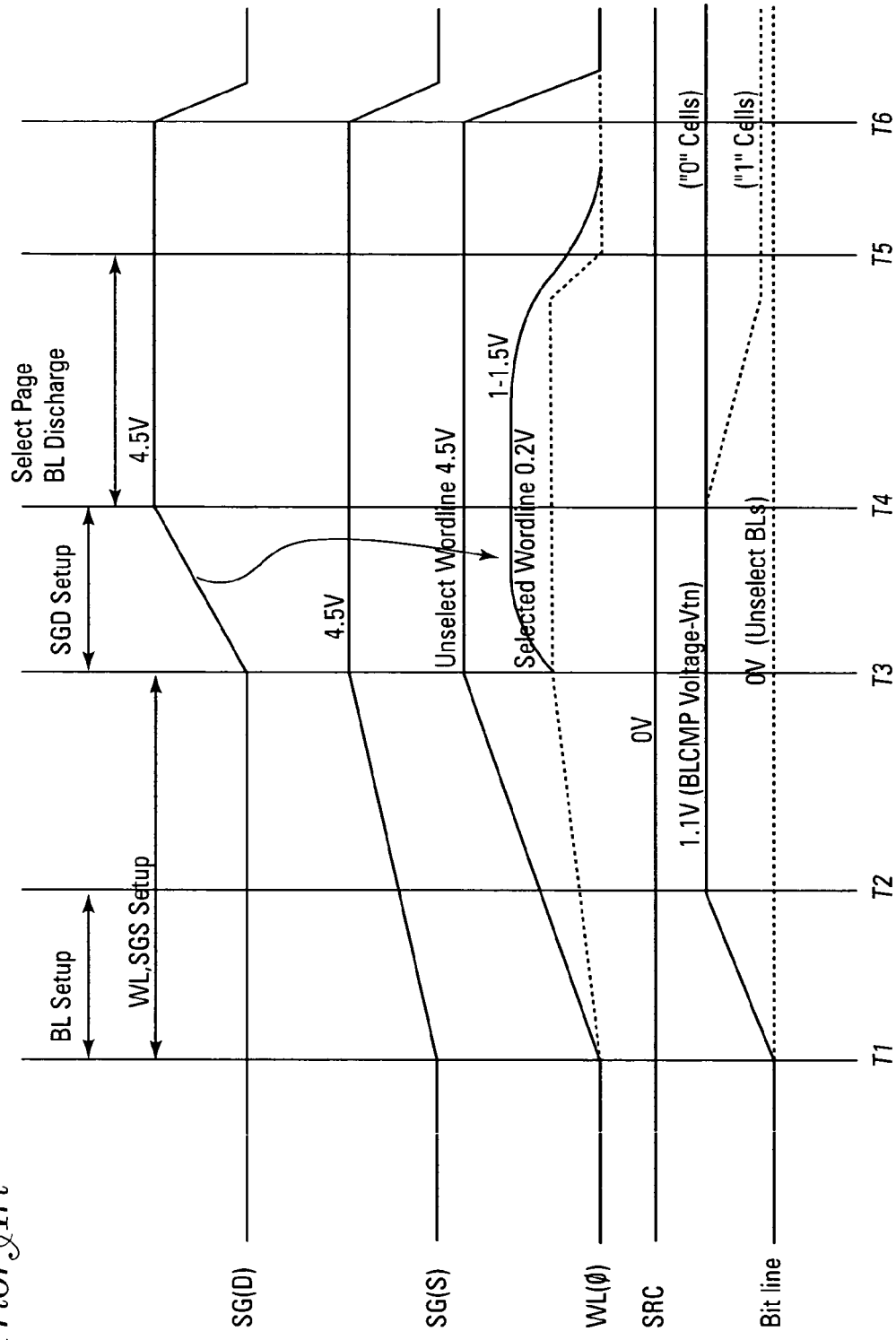
FIG. 1 shows a timing diagram for typical prior art NAND read/verify operations.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
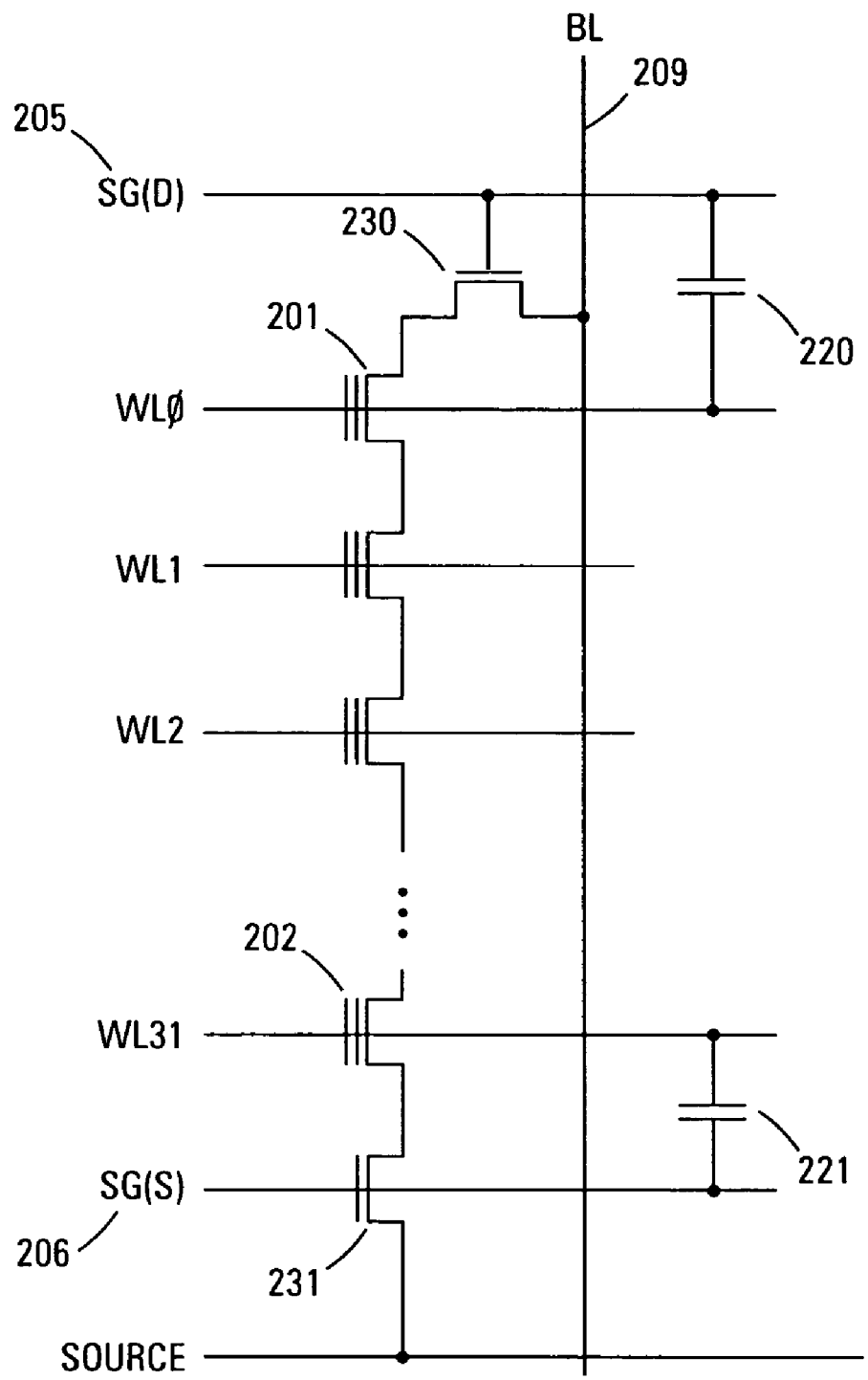
FIG. 2 shows a schematic diagram of one embodiment of a NAND flash memory array of the present invention.

FIG. 2 illustrates a schematic diagram of one embodiment of a NAND flash memory array of the present invention. The array is comprised of a large number of memory cells 201 and 202. The quantity of memory cells varies with the size of the memory device.

Select gate lines SG(D) 205 and SG(S) 206 are enabled when a read operation is to be performed. The biasing of the select gate lines turns on their respective control transistors 230 and 231. The select lines 205 and 206 are biased with 4.5V during the read operation. Due to the closeness of SG(D) 205 to WL0 201 and SG(S) to WL31 202, capacitive coupling occurs between these lines when the select lines are biased. This capacitance is represented in FIG. 2 by capacitors 220 and 221. As is well known in the art, a bitline 209 is precharged to $V_{CC}$ during a read operation.

When a wordline is not selected, it is biased at 4.5V along with SG(D) 205 and SG(S) 206. When a word line is selected, it is at or close to 0V. When WL(0) is selected and SG(D) 205 is biased at 4.5V, the capacitance 220 between these lines causes the voltage of WL(0) to momentarily go above 1.7V thus causing the cells on that wordline to be momentarily unselected. Similarly, when WL(31) is selected and SG(S) 206 is biased at 4.5V, the capacitance 221 between these lines affects the read operation.

The method of the present invention for reading a NAND flash memory array switches the timing of the SG(D) and SG(S) biasing when an address within a predetermined range is detected. In one embodiment, this address range is the cell 201 closest to the SG(D) signal 205 or the cell 202 closest to the SG(S) signal 206. In an alternate embodiment, the address range is the top three cells and the bottom three cells. The present invention is not limited to any one address range or ranges since distance from the select lines, composition of the select lines, and other factors may change the amount of capacitive coupling between the select lines and the nearby wordlines. In an alternate embodiment, the address ranges for the drain end of the column is different than the address range for the source end of the column.

In still another embodiment, only the addresses at the top of the column of cells cause the bias timing to switch. In this embodiment, if an address for the bottom of the column is detected, the SG(S) and SG(D) bias timing do not change.

Figure 3:
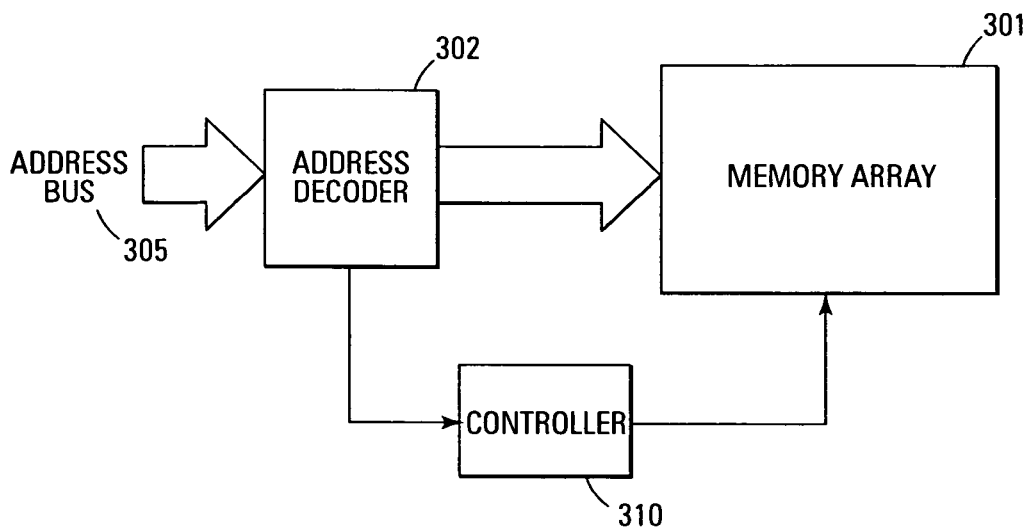
FIG. 3 shows a block diagram of one embodiment of an address decoder and NAND flash memory array of the present invention.

FIG. 3 illustrates a block diagram of one embodiment of an address decoder with a NAND flash memory array of the present invention. In one embodiment, the address decoder 302 encompasses both a row decoder and a column decoder.

The memory device's address bus 305 is input to the address decoder 302. The decoder 302 determines if the input address is within the predetermined range for a particular embodiment. If such an address is detected, the memory device controller 310 is alerted in some manner so that the timing of the generation of the select line bias voltages is changed for that particular cell location. In one embodiment, the controller 310 is alerted by an indication signal from the address decoder 302.

Figure 4:
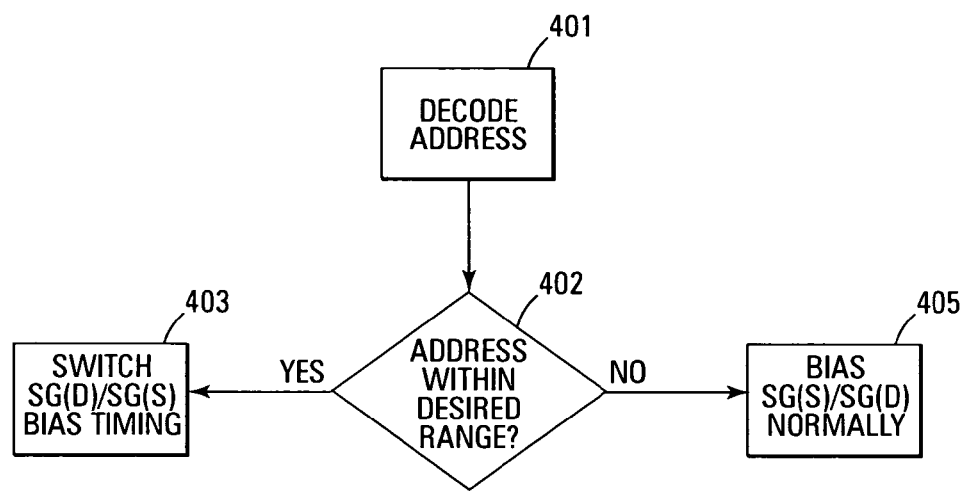
FIG. 4 shows a flowchart of one embodiment of the method of the present invention for reading a NAND flash memory array.

FIG. 4 illustrates a flowchart of one embodiment of the method of the present invention for reading or verifying a NAND flash memory array. The method decodes the input address 401 to determine if the cell to be read or verified is within a predetermined range (e.g., top of the column). If the cell is not within the predetermine range 402, the SG(D) and SG(S) lines are biased normally 405. If the cell is within the predetermined range 402, the bias timing of the SG(D) and SG(S) lines is switched 403 such that the SG(D) line is biased prior to the SG(S) line as is illustrated subsequently in FIG. 5.

Figure 5:
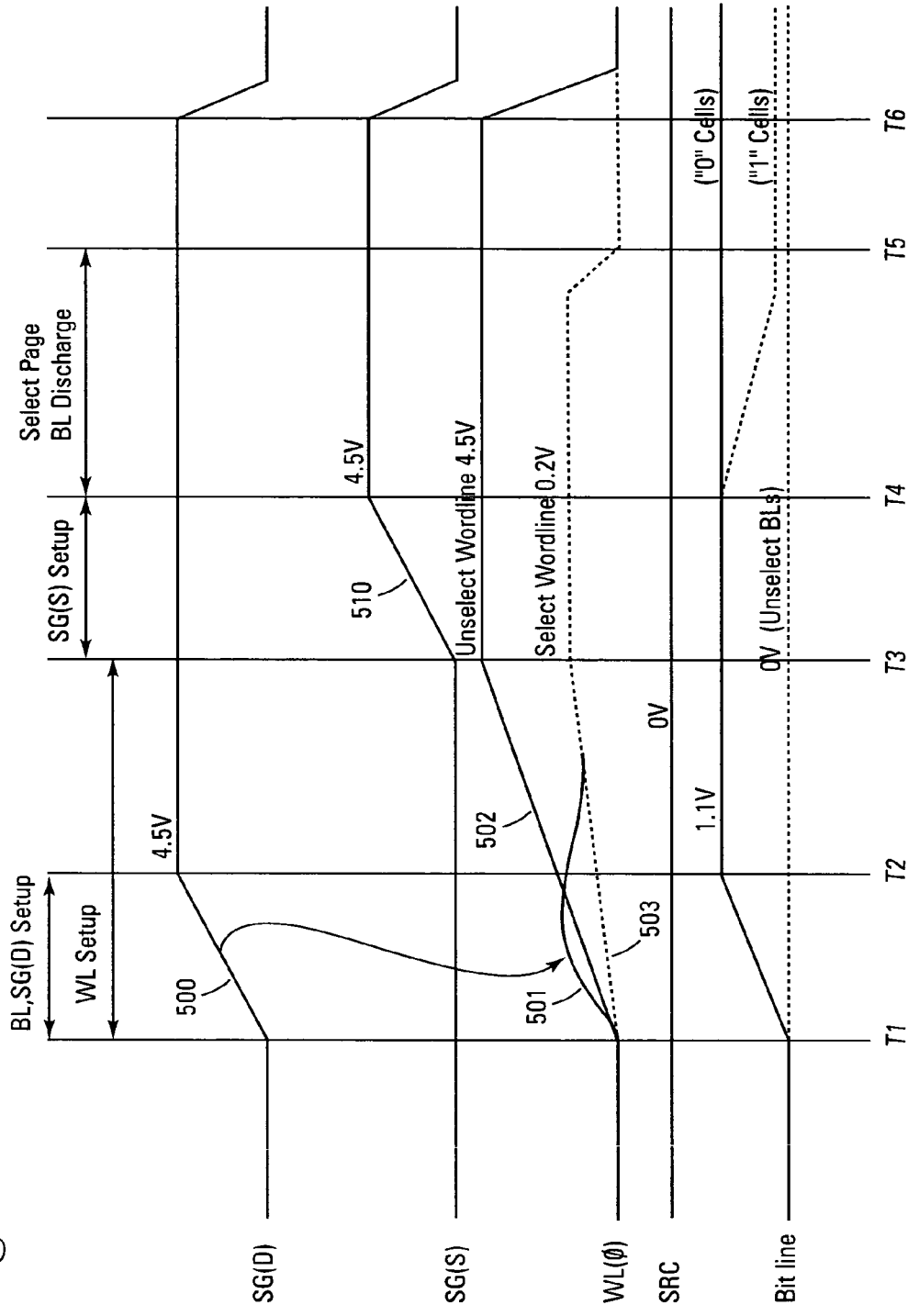
FIG. 5 shows a timing diagram for one embodiment of the method of the present invention for reading a NAND flash memory array.

FIG. 5 illustrates a timing diagram of one embodiment of the method of the present invention for reading or verifying a NAND flash memory array. In this embodiment, there are six time intervals: T1–T2 is the SG(D) set-up and bitline precharge operation, T1–T3 is the wordline set-up, T3–T4 is the SG(S) set-up, and T4–T5 is the select page read and bitline discharge. After T6, the biasing of the select gate lines and the wordlines is removed.

In the embodiment of FIG. 5, the decoded address is for a cell at the top of the column closest to the SG(D) signal. For purposes of illustration, this cell is coupled to WL0. However, the present invention is not limited to just the cells on WL0 but could have been other cells close to the top of the column of cells (e.g., WL1, WL2, WL3). The further the cell is from the select gate line, the less the capacitive coupling experienced.

When SG(D) is biased to 4.5V 500 between T1 and T2 and WL0 floats to 0.2V 503 between T1 and T3, the ramp-up of SG(D) causes WL0 to initially have a "bump" 501 in voltage between T1 and T2 before it settles down to the normal 0.2V. However, since SG(S) is biased to 4.5V 510 after this "bump" occurs (e.g., between T3 and T4), the increased voltage on WL0 does not affect the read/verify operation.

FIG. 5 also illustrates the unselected wordlines are biased to 4.5V 502. This occurs between T1 and T3. The unselected bitlines are at 0V (i.e., "1" or erased cells) while the selected bitlines are at 1.1V (i.e., "0" or programmed cells).

Figure 6:
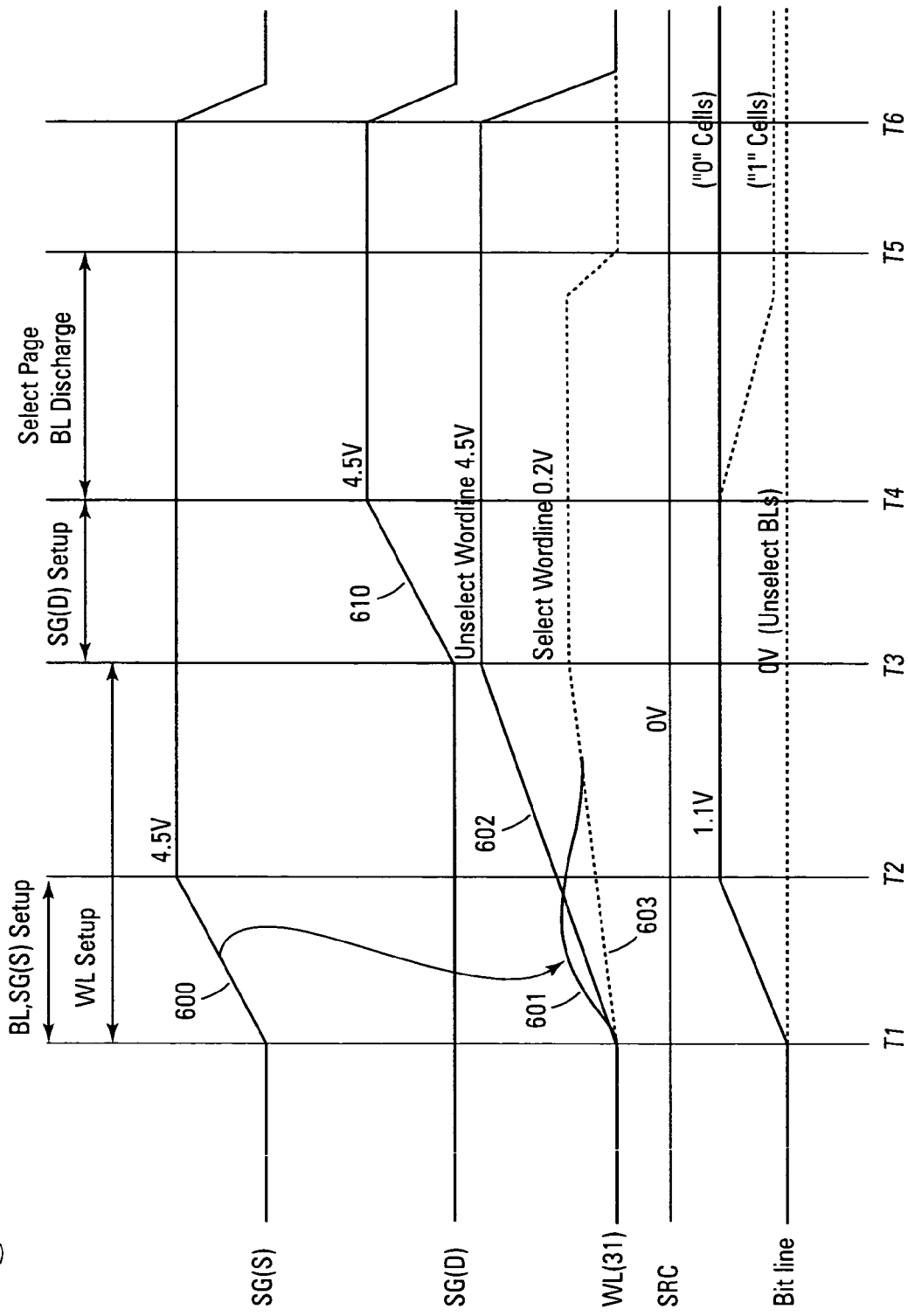
FIG. 6 shows a timing diagram for another embodiment of the method of the present invention for reading a NAND flash memory array.

FIG. 6 illustrates an alternate embodiment of the method of the present invention for reading/verifying a NAND flash memory array. In this embodiment, there are six time intervals: T1–T2 is the SG(S) set-up and bitline precharge operation, T1–T3 is the wordline set-up, T3–T4 is the SG(D) set-up, and T4–T5 is the select page read and bitline discharge. After T6, the biasing of the select gate lines and the wordlines is removed.

In the embodiment of FIG. 6, the decoded address is for a cell at the bottom of the column closest to the SG(S) signal. For purposes of illustration, this cell is coupled to WL31. However, the present invention is not limited to just the cells on WL31 but could have been other cells close to the top of the column of cells (e.g., WL28, WL29, WL30). The further the cell is from the select gate line, the less the capacitive coupling experienced.

When SG(S) is biased to 4.5V 600 between T1 and T2 and WL31 floats to 0.2V 603 between T1 and T3, the ramp-up of SG(S) causes WL31 to initially have a "bump" 601 in voltage between T1 and T2 before it settles down to the normal 0.2V. However, since SG(D) is biased to 4.5V 610 after this "bump" occurs (e.g., between T3 and T4), the increased voltage on WL31 does not affect the read/verify operation.

FIG. 6 also illustrates the unselected wordlines are biased to 4.5V 602. This occurs between T1 and T3. The unselected bitlines are at 0V (i.e., "1" or erased cells) while the selected bitlines are at 1.1V (i.e., "0" or programmed cells).

While the embodiments of the present invention discuss biasing the wordlines and select gate lines at 4.5V and 0V, it is well known in the art that variations in materials and processes result in different bias voltages. These bias voltages may vary by tenths of a volt above or below the target bias voltage. Alternate embodiments that use different manufacturing processes may use voltages other than 4.5V for biasing.

Figure 7:
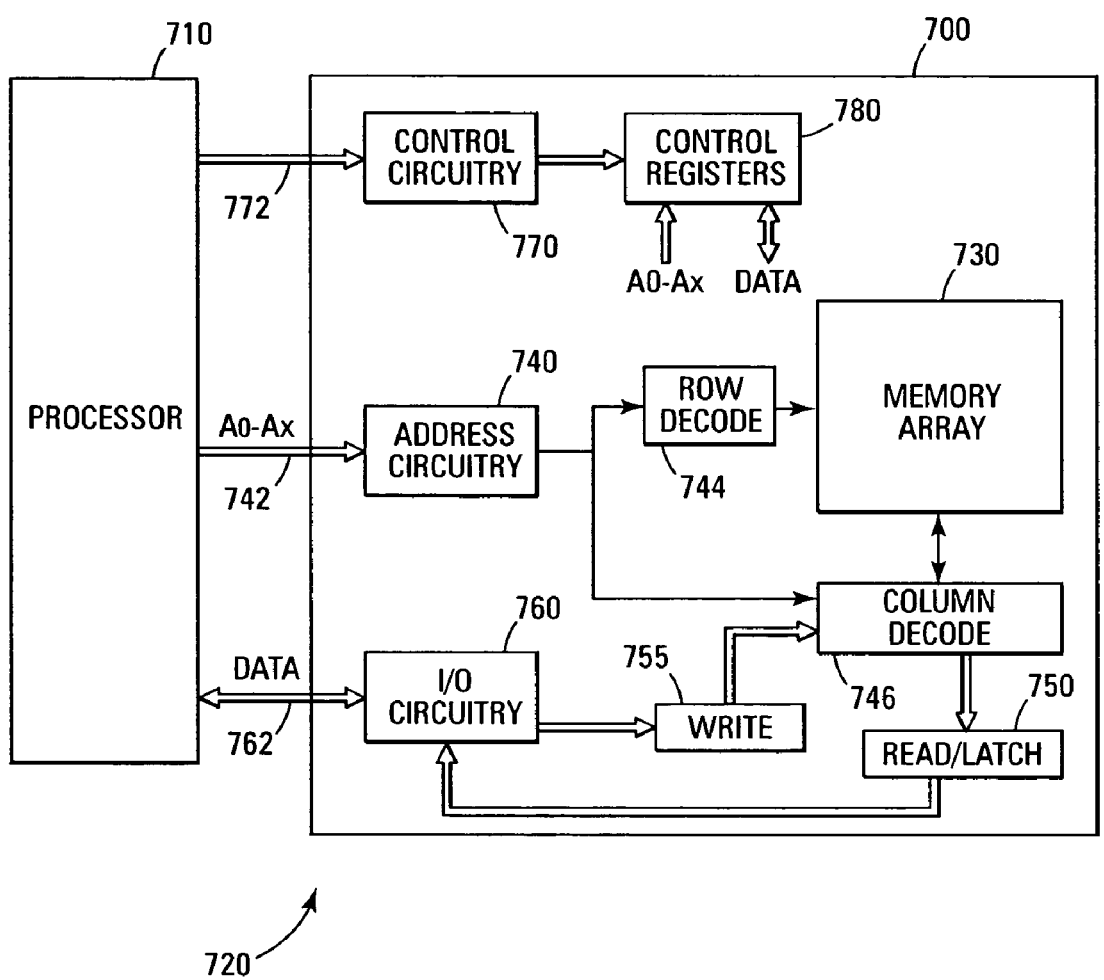
FIG. 7 shows a block diagram of one embodiment of an electronic system of the present invention incorporating the memory array of FIG. 2.

FIG. 7 illustrates a functional block diagram of a memory device 700 that can incorporate the NAND flash memory cells of the present invention. The memory device 700 is coupled to a processor 710. The processor 710 may be a microprocessor or some other type of controlling circuitry. The memory device 700 and the processor 710 form part of an electronic system 720. The memory device 700 has been simplified to focus on features of the memory that are helpful in understanding the present invention.

The memory device includes an array of memory cells 730. In one embodiment, the memory cells are non-volatile floating-gate memory cells and the memory array 730 is arranged in banks of rows and columns.

An address buffer circuit 740 is provided to latch address signals provided on address input connections A0–Ax 742. Address signals are received and decoded by a row decoder 744 and a column decoder 746 to access the memory array 730. It will be appreciated by those skilled in the art, with the benefit of the present description, that the number of address input connections depends on the density and architecture of the memory array 730. That is, the number of addresses increases with both increased memory cell counts and increased bank and block counts.

The memory device 700 reads data in the memory array 730 by sensing voltage or current changes in the memory array columns using sense/buffer circuitry 750. The sense/buffer circuitry, in one embodiment, is coupled to read and latch a row of data from the memory array 730. Data input and output buffer circuitry 760 is included for bi-directional data communication over a plurality of data connections 762 with the controller 710). Write circuitry 755 is provided to write data to the memory array.

Control circuitry 770 decodes signals provided on control connections 772 from the processor 710. These signals are used to control the operations on the memory array 730, including data read, data write, and erase operations. The control circuitry 770 may be a state machine, a sequencer, or some other type of controller. The embodiments of the method of the present invention are executed by the control circuitry 770.

The flash memory device illustrated in FIG. 7 has been simplified to facilitate a basic understanding of the features of the memory. A more detailed understanding of internal circuitry and functions of flash memories are known to those skilled in the art.

CONCLUSION

In summary, the method for reading/verifying a NAND flash memory device of the present invention alternates the select gate biasing in response to the position of the cell to be read. If the cell is close to the top of the column, the SG(D) line is biased prior to the SG(S) line. If the cell is closer to the bottom of the column, the SG(S) line is biased prior to the SG(D) line. This substantially reduces or eliminates read errors caused by capacitive coupling of the wordlines with the select gate biasing.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for reading/verifying a NAND flash memory array comprising a column of memory cells having a first end controlled by a select gate drain line and a second end controlled by a select gate source line, the method comprising:
  decoding an input address signal to determine which cell to select; and
  biasing the select gate drain and select gate source lines in an order responsive to a position of the selected cell in the column.

2. The method of claim 1 wherein the select gate drain and source lines are biased at a voltage substantially equal to 4.5V.

3. The method of claim 1 wherein if the selected cell is at the first end, biasing the select gate drain line prior to biasing the select gate source line.

4. The method of claim 1 wherein if the position of the selected cell is within three cells of the first end, biasing the select gate drain line prior to biasing the select gate source line.

5. A method for reading/verifying a NAND flash memory array comprising a column of series coupled memory cells having a drain end controlled by a select gate drain line and a source end controlled by a select gate source line, each cell controlled by a wordline, the method comprising:
  decoding an input address signal to determine which cell to select;
  if the selected cell is within a predetermined range of the drain end of the column, biasing the select gate drain line prior to biasing the select gate source line; and
  if the selected cell is within a predetermined range of the source end of the column, biasing the select gate source line prior to biasing the select gate drain line.

6. The method of claim 5 and further including:
  biasing the wordlines of the unselected cells of the column at a voltage substantially equal to 4.5V; and
  biasing the wordline of the selected cell at a voltage substantially equal to 0V.

7. A method for reading/verifying a NAND flash memory array comprising a column of series coupled memory cells having a drain end controlled by a select gate drain line and a source end controlled by a select gate source line, each cell controlled by a wordline, the method comprising:
  decoding an input address signal to determine which cell to select;
  if the selected cell is the first cell at the drain end of the column, biasing the select gate drain line prior to biasing the select gate source line;
  if the selected cell is the last cell at the source end of the column, biasing the select gate source line prior to biasing the select gate drain line;
  biasing the unselected wordlines at a first predetermined voltage; and
  biasing the selected wordline at a second predetermined voltage.

8. The method of claim 7 wherein the first predetermined voltage is substantially equal to 4.5V and the second predetermined voltage is equal to 0V.

9. A NAND flash memory device comprising:
a NAND memory array having columns of cells coupled in series, each cell selected by a wordline;
a select gate source line coupled to a source control transistor at a source end of the column of cells; and
a select gate drain line coupled to a drain control transistor at a drain end of the column of cells, the select gate drain line capable of turning on the drain control transistor prior to the source control transistor when a selected cell is within a predetermined number of cells of the drain control transistor.

10. The memory device of claim 9 and further including a bit line coupled to the drain control transistor and a source line coupled to the source control transistor.

11. A NAND flash memory device comprising:
biasing wordlines to unselected cells in the column at a voltage substantially equal to 4.5V and a wordline to the selected cell at a voltage substantially equal to 0V.

12. The memory device of claim 11 and further including:
a bitline coupled to the drain control transistor; and
a source line coupled to the source control transistor.

13. The memory device of claim 11 wherein the source control transistor and the drain control transistor are turned on by a bias voltage.

14. A flash memory device comprising:
an address decoder that decodes an input address;
a NAND memory array coupled to the address decoder, the array having columns of cells coupled in series, each cell controlled by a wordline selected by the address decoder;
a select gate drain line coupled to a drain control transistor at a drain end of the column of cells, the select gate drain line having a bias voltage prior to a select gate source line if a selected cell is within a predetermined range of the drain control transistor; and
the select gate source line coupled to a source control transistor at a source end of the column of cells, the select gate source line having a bias prior to the select gate drain line if the selected cell is within a predetermined range of the source control transistor,
biasing wordlines to unselected cells in the column at a voltage substantially equal to 4.5V and a wordline to the selected cell at a voltage substantilly equal to 0V.

15. The memory device of claim 14 wherein the address decoder comprises a row decoder and a column decoder.

16. The memory device of claim 14 wherein the select gate drain line is capacitively coupled to the wordline of the selected cell.

17. The memory device of claim 14 wherein the select gate source line is capacitively coupled to the wordline of the selected cell.

18. An electronic system comprising:
a processor that generates an address bus; and
a NAND flash memory device coupled to the processor, the memory device comprising:
an address decoder that decodes an address from the address bus;
a NAND memory array coupled to the address decoder, the array having columns of cells coupled in series, each cell controlled by a wordline selected by the address decoder;
a select gate drain line coupled to a drain control transistor at a drain end of the column of cells, the select gate drain line having a bias voltage prior to a select gate source line if a selected cell is within a predetermined range of the drain control transistor; and
the select gate source line coupled to a source control transistor at a source end of the column of cells, the select gate source line having a bias prior to the select gate drain line if the selected cell is within a predetermined range of the source control transistor.

19. The electronic system of claim 18 wherein the predetermine range is one cell.

20. A method for reading/verifying a NAND flash memory array comprising a column of memory cells having a first end controlled by a select gate drain line and a second end controlled by a select gate source line, the method comprising:
decoding an input address signal to determine which cell to select;
biasing the select gate drain and select gate source lines in an order responsive to a position of the selected cell in the column; and
a NAND memory array having columns of cells coupled in series, each cell selected by a wordline;
a select gate source line coupled to a source control transistor at a source end of the column of cells, the select gate source line capable of turning on the source control transistor prior to a drain control transistor when a selected cell is within a predetermined number of cells of the source control transistor; and
a select gate drain line coupled to a drain control transistor at a drain end of the column of cells, the select gate drain line capable of turning on the drain control transistor prior to the source control transistor when the selected cell is within a predetermined number of cells of the drain control transistor.

* * * * *

UNITED STATES PATENT AND TRADEMARK OFFICE
CERTIFICATE OF CORRECTION

| | | |
|---|---|---|
| PATENT NO. | : 6,982,905 B2 | Page 1 of 2 |
| APPLICATION NO. | : 10/682585 | |
| DATED | : January 3, 2006 | |
| INVENTOR(S) | : Dzung H. Nguyen | |

It is certified that error appears in the above-identified patent and that said Letters Patent is hereby corrected as shown below:

Column 7

Line 16, replace "biasing wordlines to unselected cells in the column at a voltage substantially equal to 4.5V and a wordline to the selected cell at a voltage substantially equal to 0V." with --a NAND memory array having columns of cells coupled in series, each cell selected by a wordline;
a select gate source line coupled to a source control transistor at a source end of the column of cells, the select gate source line capable of turning on the source control transistor prior to a drain control transistor when a selected cell is within a predetermined number of cells of the source control transistor; and
a select gate drain line coupled to a drain control transistor at a drain end of the column of cells, the select gate drain line capable of turning on the drain control transistor prior to the source control transistor when the selected cell is within a predetermined number of cells of the drain control transistor.--

Column 7,

Line 40, replace "control transistor, biasing wordlines to unselected cells in the column at a voltage substantially equal to 4.5V and a wordline to the selected cell at a voltage subtiantially equal to 0V." with --control transistor.--

UNITED STATES PATENT AND TRADEMARK OFFICE
CERTIFICATE OF CORRECTION

PATENT NO. : 6,982,905 B2
APPLICATION NO. : 10/682585
DATED : January 3, 2006
INVENTOR(S) : Dzung H. Nguyen It is certified that error appears in the above-identified patent and that said Letters Patent is hereby corrected as shown below:

Column 8,

Line 36, replace "a NAND memory array having columns of cells coupled in series, each cell selected by a wordline; a select gate source line coupled to a source control transistor at a source end of the column of cells, the select gate source line capable of turning on the the source control transistor prior to a drain control transistor when a selected cell is within a predetermined number of cells of the source control transistor; and a select gate drain line coupled to a drain control transistor at a drain end of the column of cells, the select gate drain line capable of turning on the drain control transistor prior to the source control transistor when the selected cell is within a predetermined number of cells of the drain control transistor" with --biasing wordlines to unselected cells in the column at a voltage substantially equal to 4.5V and a wordline to the selected cell at a voltage substantially equal to 0V.

Signed and Sealed this

Fifteenth Day of August, 2006

JON W. DUDAS
*Director of the United States Patent and Trademark Office*